United States Patent Office
3,443,988
Patented May 13, 1969

3,443,988

PRINTED CIRCUITS, WORK HOLDERS AND METHOD OF PREVENTING ELECTROLESS METAL DEPOSITION

John F. McCormack, Rosyln Heights, and Frederick W. Schneble, Jr., Oyster Bay, N.Y., assignors to Photocircuits Corporation, Glen Cove, N.Y., a corporation of New York No Drawing. Filed May 6, 1965, Ser. No. 453,836
Int. Cl. B44d *1/20;* C23c *3/02;* H05k *3/18*
U.S. Cl. 117—212 24 Claims

ABSTRACT OF THE DISCLOSURE

A method is provided for substantially preventing the extraneous deposition of electroless metal on selected areas of an insulating substrate which comprises providing the insulating substrate in said selected areas with a poison capable of lowering the catalytic activity in the vicinity of surface imperfections which are present in said areas.

The present invention relates to a process for the production of more accurate printed circuits by the electroless deposition of metal on a base.

Objects and advantages of the invention will be set forth in part hereinafter and in part will be obvious herefrom, or may be learned by practice with the invention, the same being realized and attained by means of the steps, processes, compositions, instrumentalities and combinations pointed out in the appended claims.

The invention consists in the novel steps, processes, compositions, parts, constructions, arrangements, combinations and improvements herein shown and described.

The present invention has for an object the provision of a novel and improved process by which the uncontrolled spread of electroless deposited metal into unwanted areas of an insulating base is substantially prevented. A further object of the present invention is the provision of a novel and improved process by which printed circuits are more accurately and reliably produced than has heretofore been customary or possible.

In the past, difficulty had been experienced in accurately depositing electroless metal on closely defined, sensitized areas of insulating surfaces. There is a tendency for non-sensitized areas of such surfaces, following prolonged immersion in or contact with autocatalytic metal solutions to become sensitized and to receive scattered or random spot deposits of electroless metal. As will be readily appreciated, deposition of electroless metal on surface areas where metal is not desired is intolerable in the preparation, for example, of printed circuits. Such undesired, random or scattered deposition of electroless metal on non-sensitized areas of the insulating surface will hereinafter sometimes be referred to as extraneous metal deposition. Extraneous metal deposition constitutes a serious limitation on manufacturing processes wherein controlled metallization of restricted areas of insulating surfaces is desired to be achieved by electroless metal deposition.

Although the invention will be particularly described with reference to electroless copper deposition, it should be understood that the principles of the invention are applicable to electroless metal deposition generally.

According to the present invention, it has been discovered that extraneous electroless metal deposition in non-sensitized areas of insulating material may be avoided or substantially reduced by treating said areas with, or incorporating therein, an agent which poisons the area against reception of electroless metal deposition.

The reason why extraneous electroless metal, e.g., copper deposition occurs is not really understood. Without wishing to be limited to this explanation, one theory to explain this phenomenon is that all insulating surfaces of the type described contain small pores, pits and other surface imperfections. Upon prolonged exposure to the electroless metal bath, these surface imperfections become catalytic, perhaps by entrapment of electrical charges or activated hydrogen or hydrides. The surface imperfections then act as catalytic sites which initiate electroless metal deposition in the undesired areas. Once initiated, the extraneous deposition of metal at these sites becomes autocatalytic.

The poisons of this invention apparently act to prevent entrapment of electrical charges or reducing ions in the imperfections of the non-sensitized insulating areas, or, alternatively, to neutralize such charges immediately upon entrapment or to lower the activity of the surface in general so that such imperfections cannot become catalytic. As will be appreciated, the charges that could be entrapped in the pits or bore holes include charged ions, as well as electrons.

Effective as poisons are those elements and components which lower the catalytic activity in the vicinity of pits, pore holes and other surface imperfections present in non-catalyzed areas of insulating material.

Particularly useful as poisons are sulfur, selenium, tellurium, polonium and arsenic. Such elements may be used either in elemental or compound form. Preferably, they are incorporated in or coated on the insulating material in the form of organic or inorganic compounds of the elements.

Inorganic compounds in which the described elements are combined with metals of Groups I–A, II–A, VI–B and VII of the Periodic Table of Elements, aluminum and ammonia, may be used. Especially suitable for use are such inorganic compounds in which the active elements are combined with alkali and alkaline earth metals, aluminum and ammonium.

Preferred for use in the practice of this invention are inorganic and organic sulfur compounds.

Among the organic sulfur compounds may be mentioned the following: aliphatic sulfur-nitrogen compounds, such as thiocarbamates, e.g., thiourea; 5-membered heterocyclics containing S-N in the 5-membered ring, such as thiazoles and iso-thiazoles, e.g., 2-mercapto benzol thiazole and the like; dithiols, e.g., 1,2-ethanedithiol and the like; 6-membered heterocyclics containing S-N in the ring, such as thiazines, e.g., 1,2-benzisothiazine, benzothiazine, and the like; thioamino acids, such as methinonine, cystine, cysteine, and the like; thio derivatives of alkyl glycols, such as 2,2′ thiodiethanol, dithiodiglycol, and thioglycollic acid; and the like. Also useful are polysulfide elastomers, such as by the reaction between alkyl dihalides and alkali sulfides. Among the preferred inorganic sulfur compounds may be mentioned: alkali metal sulfides, e.g., sodium sulfide, potassium sulfide, sodium polysulfide, potassium polysulfide; alkali metal thiocyanates, such as sodium and potassium thiocyanates; and alkali metal dithionates, such as sodium and potassium dithionate.

Selenium, tellurium, polonium and arsenic analogs of the described sulfur compounds may be used.

Typical of such compounds are the sulfides, polysulfides, selenides, selenates, tellurides, tellurates, polonides, arsenides, arsenites, and arsenates.

Among the organic arsenicals may also be mentioned arsonic acids and arsinic acids, including salts of such acids, e.g., alkali and alkaline earth metal salts, aluminum, ammonium, and the like, including mixtures of the foregoing.

The poisons described herein may be incorporated into or used to treat insulating materials on which electroless metal deposition is desired in a wide variety of ways.

For example, the poisons may be dissolved in an appropriate solvent, and the insulating material contacted therewith as by immersion or spraying followed by drying. Areas on which electroless copper deposition is desired may be appropriately masked. Alternatively, the entire surface may be treated with the solution of the poison, and then selected areas thereafter sensitized for the reception of electroless metal deposition.

In this embodiment, the poisons could be dissolved in organic solvents. If desired, the solvent could contain an organic resin binder. Here again, the substrata may be dipped into or otherwise suitably contacted with the resulting solution, and then dried. When the system contains a binder, evaporation of the solvent following drying would result in the deposition on the substratum of a resin having the poison incorporated therein. A resin system containing the poison could also be used as an ink to print a negative of a desired pattern on an insulat-surface.

Alternatively, a resin system containing the poison could be used as a coating for the insulating surface, or could itself serve as the substratum on which the electroless metal deposition could occur.

The poisons or solutions thereof may also be incorporated into photoresists, which may then be used in turn to coat a suitable substratum. An image of a desired circuit pattern could then be photoprinted on the resist in such a way as to leave standing on the substratum a negative image of the pattern made up of the poisoned resist.

It will be understood that the active poisons may either be dissolved in the resinous compositions, or may be dispersed therein in the form of finely divided solid particles.

In still a further embodiment of the invention, the poison may be incorporated into a resin system, after which the resin could be molded to form a three-dimensional article having the poison dispersed therein. This article could then be used as the substratum to be metallized, or a strip thereof could be laminated to the substratum to be metallized.

The resin inks could also be used to impregnate paper, wood, fiberglass cloth, polyester fibers, and other porous materials to be used as base materials for metallization.

In making the poison treating solutions of the type described, any solvent capable of dissolving the poison may be used. Besides water, organic solvents, such as saturated and unsaturated alkyl hydrocarbons, as well as aryl, alkyl aryl and aryl alkyl hydrocarbons may be used. Halogenated forms of such hydrocarbons are also suitable.

Polar organic solvents such as aldehydes, ketones, acids, alcohols, and amines, including mixtures of the foregoing, may also be used.

Typical of the ketones are acetone, methylethyl ketone, methyl isobutyl ketone, mesityl oxide, di-isobutyl ketone, ethyl butyl ketone, and isophorone.

The alcohols which may be used as solvents include primary, secondary and tertiary mono-hydric alcohols, and also polyhydric alcohols, Typical are methyl alcohol, ethyl alcohol, isopropyl alcohol, n-propyl alcohol, butyl alcohol, secondary butyl alcohol, n-butyl alcohol, isobutyl alcohol, methyl isobutyl carbinol, and the higher alcohols, such as iso-octyl alcohol.

Typical of the polyhydric alcohols, i.e., alcohols which have more than one hydroxyl group, are ethylene glycol, trimethylene glycol, tetramethylene glycol, pentamethylene glycol, hexamethylene glycol, heptamethylene glycol, glycerol and the like.

Carboxylic acids which may be used as the solvent include formic acid, acetic acid, propionic acid, n-butyric acid, isobutyric acid, n-caproic acid, n-heptoic acid, caprylic acid, n-nonylic acid. Also may be used halogen acids such as dichloroacetic acid.

Among the aldehydes may be mentioned acetaldehyde, propionaldehyde, n-butyraldehyde, isobutyraldehyde, n-valeraldehyde, n-capronaldehyde, n-heptaldehyde, and the like.

Also useful as the solvent portion of the system are amines, including primary, secondary and tertiary amines. Typical of the amines are methyl amine, dimethyl amine, trimethyl amine, ethyl amine, and n-propyl amine. Also may be mentioned polyamides having two or more primary nitrogens such as ethylene diamine, propylene diamine, diethylene triamine, dipropylene triamine, triethylene tetramine, tetraethylene pentamine, tetrapropylene pentamine and mixtures of the foregoing. Also suitable as the solvent are amides, including polyamides, and poly-amido-amines. Typical of the amides are formamide, acetamide, propionamide, and butyramide.

The polyamides, amido-amines and poly-amido-amines which may be used are condensation products of mono-carboxylic caids, polycarboxylic acids, or mixtures of mono-carboxylic acid and polycarboxylic acids of the type described with polyamines of the type described.

Also as the solvent may be used heterocyclic nitrogen containing compounds such as pyrrole, pyrrolidone, piperidine, pyrridine and the like; sulfur containing organic compounds such as dimethyl sulfoxide, methyl mercaptan, ethyl mercaptan, and the like; halogenated hydrocarbon solvents such as methylene chloride, propylene chloride; ethers such as ethyl ether, methyl ether and propyl ether; and esters, such as ethyl formate, methyl acetate, n-butyl acetate, n-amyl acetate, isoamyl acetate, methyl propionate and the like. As the solvent may also be used substituted and unsubstituted hydrocarbons of the alkane, alkene and alkyne series, and also substituted and unsubstituted hydrocarbons of the aromatic series. The selection of the solvent will depend of course upon the poison used.

The resins which may constitute the dispersing medium or solvent or one of the dispersing mediums or solvents for the poisons include thermosetting resins, thermoplastic resins, and mixtures of the foregoing.

Among the thermoplastic resins may be mentioned the acetal resins; acrylics, such as methyl methacrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile styrene copolymer; and acrylonitrile-butadiene-styrene copolymers; polychlorotrifluoroethylene; polytetrafluoroethylene; and vinyl polymers and copolymers such as vinyl acetate, vinyl chloride, vinyl chloride-acetate copolymer; and vinylidene chloride.

Among the thermosetting resins may be mentioned diallyl phthalate; furan; melamine-formaldehyde; phenol-formaldehyde and phenol-furfural copolymers, alone or compounded with butadiene-acrylonitrile copolymer or acrylonitrile-butadiene-styrene copolymers; polyacrylic esters; silicones; urea formaldehydes; epoxy resins; allyl resins; glyceryl phthalates; polyesters; and the like.

The active poison, it should be clear, may be dissolved into the resinous composition or dispersed therein in the form of finely divided solid particles.

The concentration of the poison in the compositions of the type described will be an amount that is effective to produce results of the type described. Within this limitation, the concentration of poison will vary from about 0.25 percent by weight, to about 80 percent by weight, and preferably between about 1 and 10 weight percent of the composition.

In using those systems which contain an organic solvent alone, it is only necessary to dip the substratum to be seeded in the solution of the poison and permit the substratum to dry, following which selected areas may be seeded and sensitized, and then contacted with the electroless metal deposition solution, to thereby initiate deposition of the electroless metal.

According to the process of the present invention, an insulating base member to be formed into a printed circuit member may be provided with laminated conducting foil on both of its sides or it may be treated by the process of the present invention to provide both sides with adherent conductive layers, and in either instance, the conducting layers on the two faces of the insulating base member may be interconnected at selected points by conductive areas which pass through one or more holes in the base member.

According to a modification of the process of the present invention, the base member is initially a suitable shaped piece of insulating material such as is desired for the base member of the printed circuit. This base member is apertured at the desired places to provide for interconnections between the circuit elements on one side and those on the other side of the base member. The two sides of the base member are then provided with restricted areas of coating material containing the active poison as by coating the entire surfaces of the base member and removal of the coating material from certain of the areas, or more conveniently by applying the active poison containing material to limited areas of the two faces of the base member, as by printing or silk-screen stenciling. Thereafter, the coated base member is subjected to treatment with a seeding or sensitizing bath or both, after which the entire base member is immersed in an electroless plating bath, such as will deposit an adherent layer of a conductive metal, for instance copper, and this step may then be followed by the electrolytic deposition of copper to the desired thickness.

In a preferred embodiment, the entire surface of the insulating substratum may first be rendered sensitive to the reception of electroless copper. The active, poison containing material may then be applied to limited areas of the base material, as by printing or silk-screen stenciling. Thereafter, the base is contacted with an electroless metal deposition solution to deposit electroless metal on the sensitized areas not coated with the poison containing material.

A preferred, poison containing coating material suitable for practicing the aforesaid preferred embodiment, is a water-insoluble, film forming material containing a polysulfide rubber, such as "Thiokol LP-3" of the kind described in Thiokol Bulletin LP-4 for May 1961, or a polysulfide containing epoxy resin, or an epoxy resin material containing a small amount of a polysulfide, e.g., Thiokol LP-3, or of thiourea.

One such coating material is formed by mixing thoroughly from about 1 percent to about 10 percent, preferably about 2 percent of Thiokol LP-3 polysulfide resin in an epoxy resin, such as ERL 2256, which may then be diluted to form either a coating material which may be sprayed or brushed on the surface, or may be prepared in a more viscous form so that it may be applied by conventional silk-screening or ink-roller techniques.

By way of illustration and not of limitation, typical examples of poison containing compositions for use in carrying out the present invention are described below.

Example 1

| | | |
|---|---|---|
| Epon 1001-X-75 | lbs | 3.30 |
| QR-455 | lbs | 4.94 |
| Diethylene glycol monobutyl ether | lbs | .44 |
| Hycar MBTN | lbs | 0.50 |
| Ethylene glycol monoethyl ether monoacetate | cc | 50 |

Epon 1001-X-75 from Shell Chemical Co. is a 75 percent solution in xylene of a bisphenol A epoxy resin with an epoxy equivalent of 450-550.

QR-455 from Rohm & Haas Co. is a 50 percent solution of a flexible acrylic resin in a mixture of ¾ high boiling petroleum solvent and ¼ ethylene glycol monoethyl ether monoacetate.

Hycar MBTN from B. F. Goodrich Chemical Co. is a mercaptan terminated butadiene acrylonitrile copolymer containing 24 percent acrylonitrile and 3.9 percent mercaptan.

This is suitable for application by a roller. It is cured in an oven at 325° F. for 30 minutes following application.

Eample 2

| | Gm. |
|---|---|
| Epoxy novalac resin DEN 438 | 157 |
| Aromatic naphtha | 77 |
| Methyl isobutyl lactone | 35 |
| Cyclohexanone | 24 |
| Bentone 27 | 7 |
| Methanol | 0.2 |
| Thiokol LP-3 | 50 |
| n-Phenylenediamine-4,4′ methylenedianiline | 30 |

The indicated ingredients, with the exception of Thiokol LP-3 and the n-phenylenediamine-4,4′ methylenedianiline eutectic are milled together on a three roll paint mill. LP-3 and the n-phenylenediamine-4,4′ methylenedianiline eutectic are added shortly before use. The resulting composition is suitable for application as an ink, as by silk-screen printing. This composition should be cured at about 130° C. for 2 hours following application.

In Example, 2 Thiokol LP-3 was obtained from the Thiokol Chemical Corp. and may be represented as $$HS—(C_2H_4—O—CH_2—O—C_2H_4—S—S)_6—C_2H_4O—CH_2—OC_2H_4—SH$$

DEN 438 is an epoxy novalac resin obtainable from Dow Chemical Co. Bentone 27 is an alkyl ammonium bentonite from National Lead Co.

Example 3

| | Parts |
|---|---|
| Epon 828 | 100 |
| Thiokol LP-3 | 50 |
| Dimethylaminomethyl phenol | 10 |
| Filler | 3-10 |

Epon 828 from Shell Chemical Co. is a bisphenol A based epoxy resin with an epoxide equivalent of 190. Thiokol LP-3 has been described in Example 2.

The composition of Example 3 is particularly suitable for use as a coating on a metal rack used for holding parts to be contacted with an electroless copper solution, especially in those processes wherein the rack and work pieces are first dipped into a seeding and/or sensitizing solution prior to treatment with the electroless copper solutions. Such a composition could be used to coat metal racks which are not naturally catalytic to the reception of electroless copper, but are rendered so by treatment in the seeder and/or sensitizing solutions.

Such a composition could also be used to good advantage to coat the interior walls of a non-catalytic metal container housing an electroless copper solution, in order to prevent metal deposition on such walls.

The composition of Example 3 is also suitable for coating racks and other work holders, and electroless metal deposition solution containers and the like, which are made of normally insulating material such as plastic, but which suffer prolonged or repeated exposure to electroless metal solutions.

Typical of the electroless plating baths which may be used to carry out the present invention are electroless copper solutions.

Electroless copper solutions are capable of depositing copper without the assistance of an external supply of electrons. Such solutions comprise water, a small amount of copper ions, e.g., a water soluble copper salt, a reducing agent for copper ions, a complexing agent for copper ions, and a pH regulator.

The selection of the water soluble copper salt for such baths is chiefly a matter of economics. Copper sulfate is preferred for economic reasons, but the halide, nitrate, acetate and other organic and inorganic acid salts of copper may also be used.

Rochelle salts, the sodium salts (mono-, di-, tri- and tetrasodium) salts of ethylenediaminetetraacetic acid, nitrilotriacetic acid and its alkali salts, gluconic acid, gluconates, and triethanolamine are preferred as copper ion complexing agents, but commercially available glucono-δ-lactone and modified ethylenediamineacetates are also useful, and in certain instances give even better results than the pure sodium ethylenediaminetetraacetates. One such material is N-hydroxyethylethylenediaminetriacetate. Other materials suitable for use as cupric complexing agents are disclosed in U.S. Patents Nos. 2,996,408, 3,075,856, 3,075,855 and 2,938,805.

Copper reducing agents which have been used in alkaline electroless metal baths include formaldehyde, and formaldehyde precursors or derivatives, such as paraformaldehyde, trioxane, dimethyl hydantoin, glyoxal, and the like. Also suitable as reducing agents in alkaline baths are borohydrides, such as alkali metal borohydrides, e.g., sodium and potassium borohydride, as well as substituted borohydrides, e.g., sodium trimethoxyborohydride. There may also be used in such baths, boranes, such as amine boranes, e.g., isopropylamine borane, morpholine borane, and the like.

Typical of the copper reducing agents for use in acid electroless copper solutions are hypophosphites, such as sodium and potassium hypophosphite, and the like.

The pH adjustor or regulator may consists of any acid or base, and here again the selector will depend primarily on economics. For this reason, the pH adjustor on the alkaline side will ordinarily be sodium hydroxide. On the acid side, pH will usually be adjusted with an acid having a common anion with the copper salt. Since the preferred copper salt is the sulfate, the preferred pH adjustor on the acid side is sulfuric acid.

In operation of the bath, the copper salt serves as a source of copper ions, and the reducing agent reduces the copper ions to metallic form. The reducing agent itself is oxidized to provide electrons for the reduction of the copper ions. The complexing agent serves to complex the copper ion so that it will not be precipitated, e.g., by hydroxyl ions and the like, and at the same time makes the copper ion available as needed to the reducing action of the reducing agent. The pH adjustor serves chiefly to regulate the internal plating voltage (i.e., current density) of the bath.

In addition, both stabilizing radicals such as cyanide, and elements such as vanadium, arsenic and antimony, may be added to enhance the physical properties of the electroless copper deposits, particularly brightness and ductility, and also to improve stability.

A typical electroless copper deposition bath made according to the present invention will comprise:

Electroless metal salt—0.002 to 0.60 mole
Reducing agent—0.03 to 1.3 moles
Electroless metal complexing agent—0.7 to 2.5 times the moles of copper
Stabilizing element or radical—0.1 to 1000 microgram atoms
pH adjustor—sufficient to give desired pH
Water—sufficient to make 1 liter.

Specific embodiments of a high plating potential solution comprise:

Copper salt—0.002 to 0.60 mole
Formaldehyde—0.03 to 1.3 moles
Copper ion complexing agent—0.7 to 2.5 times the moles of copper
Stabilizing element or radical—0.1 to 1000 microgram atoms
Alkali metal hydroxide—sufficient to give pH of 10–14
Water—sufficient to make 1 liter.

Preferred embodiments of highly active solutions comprise:

A soluble cupric salt, preferably cupric sulfate—0.002 to 0.2 mole
Alkali metal hydroxide, preferably sodium hydroxide, to give pH of 10–14
Formaldehyde—0.06 to 0.50
Cupric ion complexing agent—0.001 to 0.60 mole (and usually at least about 10% molar excess based on the amount of cupric salt employed)
Sodium cyanide—.00005 to 0.01 mole
Water—sufficient to make 1 liter.

In considering the general and specific working formulae set forth herein, it should be understood that as the baths are used up in plating, the ingredients will be replenished from time to time. Also, it is advisable to monitor the pH, and the concentration of the stabilizing element or radical, and to adjust them to their optimum value as the bath is used.

For best results, surfactants in an amount of less than about 5 grams per liter may be added to the baths. Typical of suitable surfactants are organic phosphate esters, and oxyethylated sodium salts.

Electroless copper plating solutions particularly suitable for use are described in U.S. Patent 3,095,309. In the baths described therein, water soluble cyanide compounds are used as the stabilizing agent.

Conventional sensitizing and seeding solutions, such as an acidic aqueous solution of stannous chloride ($SNCl_2$), followed by treatment with a dilute acidic aqueous solution of palladium chloride ($PdCl_2$), may be used to render the insulating base materials catalytic to the reception of electroless metal deposition.

Alternatively, extremely good sensitization is achieved by using an acidic aqueous solution containing a mixture of stannous chloride and precious metal chloride, such as palladium chloride, the stannous chloride being present in stoichiometric excess, based on the amount of precious metal chloride.

Other ways of sensitizing non-metallic surfaces for reception of an electroless metal deposit from baths of the type described herein are the catalytic resinous compositions disclosed in co-pending application Ser. No. 785,703, filed Jan. 8, 1959. Also highly suitable are the resinous sensitizing seeding compositions described in United States Patent No. 3,146,125.

The sensitizer-seeder compositions of the referred to co-pending application and patent comprise an agent catalytic to the reception of electroless copper dispersed throughout an organic system which may be and preferably is or contains a resinous composition. The catalytic agents may be dispersed throughout the resin system in the form of finely divided solid particles, or may be dissolved in the system. The catalytic agent may be any of the metals of Groups 4–B, 5–B, 6–B, 8, 1–B, 2–B, 3–A and 4–A of the Periodic Table of Elements, or oxides or salts of the elements of Groups 2–B, 3–A, 4–B, 5–B and 6–B of the Periodic Table of Elements, including mixtures of the foregoing. Catalytic resin compositions containing such metals and compounds may be printed directly on surfaces coated with, impregnated with or otherwise treated with the poisons of this invention.

Following pre-treatment with the poisons of this invention, and sensitization, the surface to be plated is immersed in the autocatalytic copper baths, and permitted to remain in the bath until a copper deposit of the desired thickness in the desired areas has been built up.

In one embodiment, the present invention comprises the application to a conventional "board" or other support of a patterned layer of a water-insoluble material which contains a substantial quantity of the active poison, such as obtained by the use of an epoxy resin coating material containing a small percentage of an active sulfur-containing compound, such as a polysulfide rubber. When the poison containing material has been applied to the board, the board is preliminarily sensitized so as to be receptive to electroless metal deposition and is then subjected to the electroless metal solution, whereby metal is securely deposited on those areas of the base which have not been covered with the sulfur-containing material.

The poison containing, water-insoluble material, e.g., resin, may be applied to the base member by a process such as silk-screening, or it may be applied over the entire surface and removed from all of those areas where a deposit of copper is desired.

In this embodiment, seeding and sensitizing may be most conveniently accomplished by treatment with the aqueous or organic seeding solutions described supra. The areas coated with the poison containing coating or "sub" are not affected by these seeding and sensitizing solutions, and remain completely inert to electroless metal deposition.

The process of the present invention may also be applied to the production of a printed circuit member by the print and etch technique, starting with an insulating base member which is provided on one or two faces with relatively thin adherent foils of conductive metal, such as copper foil. After etching in any conventional manner to provide the desired circuit elements on one or two faces of the base member, the sheet of laminated stock is drilled or punched to provide the apertures through which the circuit elements on one side of the base member are to be electrically connected to circuit elements on the other side of the base member. The walls surrounding the apertures are then rendered sensitive to electroless copper deposition by immersing the prepared base member in seeding and sensitizing solutions of the type described above. Following seeding, the two sides of the laminated stock are covered with a relatively thin, substantially uniform coating of an insulating, water-insoluble film which preferably comprises a colloidal suspension of an elastomeric film forming material such as rubber, synthetic rubber, or a polyester resin, containing a substantial amount of the active poisons described herein preferably in a water-insoluble form, thus protecting the coated areas against electroless metal deposition.

Next, the panel is transferred to an electroless depositing solution which deposits conductive metal, such as copper, on those areas of the base member which have not been coated with a layer of the poison containing material. Thus, each of the apertures interconnecting with the circuit elements on the two sides of the base member may be provided with an adherent layer of copper making good circuit contact with the circuit elements.

When the original base material is not provided with laminated copper or other metal foils on its opposite faces, and merely comprises a base member of insulating material such as a sheet of epoxy resin, melamine resin, phenolformaldehyde resin, or other suitable insulating material, the base member may be initially provided with the apertures through which connections are to be made from the circuit elements on one side of the base member, and the entire base member, including the walls surrounding the apertures are appropriately seeded to render it catalytic to the reception of electroless copper. The two faces of the base member are then coated in appropriate areas with a resinous composition containing the active poisons described herein. These areas may be coated, for example, by silk-screen stenciling.

Thereafter, the member bearing areas of a poison containing coating conforming to the eventual areas to be left free of any electroless deposit of metal, is immersed in a bath for the electroless deposition of copper or other adherent conductive metal, of which examples have been given above.

The poisons of the present invention are remarkable in that they prevent extraneous electroless metal deposition on any surface on which or in which they are present, even though that surface may be exposed to electroless metal baths for prolonged periods of time.

Where electroless metal deposition is desired on a metallic member rather than an insulating surface, the metal should be degreased, and then treated with acid, such as hydrochloric or phosphoric acid, to free the surface of oxides. The portion of the metal surface on which electroless metal is not desired will then be coated with the poison containing components described. In treating metal, it is of course not necessary to seed or sensitize.

As already mentioned, the poisons of this invention may be incorporated into or used as coatings for the work holders, such as racks, used in electroless metal deposition, as well as the containers housing such solutions, so as to prevent electroless metal deposition on the container walls and on the work piece holders.

Thus, the containers or work piece holders may be made out of resinous compositions containing the active poisons of this invention. Alternatively, resinous compositions containing the active poisons could be used to coat or otherwise treat the containers and work holders.

Heretofore, commercialization of processes utilizing electroless deposition has been impeded by extraneous deposition of electroless metal on the work holders and containers for such solutions.

For example, where non-conductive parts are to be electroplated, e.g., with copper, nickel or chromium, after electroless metallizing, it has previously been necessary to remove the parts from the work holders used in electroless metallizing and re-position them on electroplating racks for electroplating. One rack or work holder could not previously be used for both processes because the insulating rack coating would be sensitized and metallized simultaneously with the non-conductive parts during the electroless metal sensitization and deposition portions of the cycle. The poison compositions of this invention, when used to coat the rack in such an operation, prevent electroless metal deposition on the racks, thereby permitting utilization of the same racks during electroplating, thereby effecting considerable economy of operation.

The invention in its broader aspects is not limited to the specific steps, processes and compositions shown and described but departures may be made therefrom within the scope of the accompanying claims without departing from the principles of the invention and without sacrificing its chief advantages.

What is claimed:

1. In a method of plating metal from electroless metal deposition solutions, the improvement for substantially preventing extraneous deposition of electroless metal on areas of insulating material exposed to said solutions but on which electroless metal deposition is not desired, which comprises, providing the insulating material in said areas with a poison capable of lowering the catalytic activity in the vicinity of surface imperfections which are present in said areas.

2. A method for substantially preventing extraneous deposition of metal from electroless metal deposition solutions on areas of insulating surfaces which are exposed to said solutions for relatively long periods of time but on which electroless metal deposition is not desired, which comprises, incorporating into said areas a poison which is capable of lowering the catalytic activity in the vicinity of surface imperfections present in said areas.

3. The method of claim 1 wherein the poison comprises an element selected from the group consisting of sulfur, tellurium, selenium, polonium, arsenic and mixtures of the foregoing.

4. A method for electrolessly metallizing designated areas of an insulating member while preventing extraneous metallization on insulating areas contiguous thereto, which comprises, providing the surface of the contiguous areas with a poison capable of lowering the catalytic activity in the vicinity of surface imperfections present in said areas, and the surface of said designated areas with an agent capable of catalyzing the deposition of electroless metal, and then contacting the insulating member with an electroless metal deposition solution to thereby deposit electroless metal on the designated areas while preventing electroless metal deposition in the contiguous areas thereto.

5. The method according to claim 4 in which the poison is applied to said contiguous areas by coating said areas with a resinous composition containing the poison.

6. The method according to claim 4 in which a coating composition containing the poison is applied over the entire surface of the insulating member, and areas of the poison containing coating thereafter removed from the insulating member to form said designated areas on which metallization is desired.

7. The process according to claim 4 in which the entire surface of the insulating member is covered with a coating material containing the poison, after which said designated areas are provided by bonding to the poison containing coating, an agent catalytic to the reception of electroless metal.

8. The method of claim 4 wherein said member has the poison dispersed therein, and wherein said designated areas on which electroless metal is desired are provided by bonding thereto a resinous composition containing an agent catalytic to the reception of electroless metal.

9. The method of claim 4 wherein the entire surface of the insulating member is rendered catalytic to the reception of electroless metal, following which said contiguous areas are provided by printing with a resinous composition containing the poison.

10. As a new article of manufacture, an insulating base member having a coating of electroless metal on designated areas of the surface, and surface areas which are free of metal and which comprise a poison which is capable of lowering the catalytic activity in the vicinity of surface imperfections present in said metal free areas when the base member is contacted with an electroless metal deposition solution.

11. The new article of manufacture of claim 10 wherein said poison comprises an element selected from the group consisting of sulfur, selenium, tellurium, polonium, arsenic and mixtures of the foregoing.

12. Work holders for use in electroless deposition solutions having exposed surfaces subject to contact with such solutions, such surface being non-catalytic to the reception of electroless metal deposition and containing a poison which is capable of lowering the catalytic activity of the surface in the vicinity of surface imperfections present in said surface when the surface is in contact with an electroless metal solution, to thereby prevent electroless deposition of metal on the surface in the vicinity of said imperfections.

13. Work holders for use in holding insulating parts sequentially in electroless metal seeding solutions and then in electroless metal deposition solutions, during a process for metallizing such insulating parts electrolessly, said work holders having a poison which is capable of lowering the catalytic activity of the surface in the vicinity of surface imperfections present in said surface when the surface is in contact with an electroless metal solution, to thereby prevent electroless deposition of metal on the surface in the vicinity of said imperfections.

14. Containers for electroless deposition solutions having surfaces subject to contact with such solutions which are normally non-catalytic to the reception of electroless metal, such surfaces being provided with a poison which is capable of lowering the catalytic activity of the surface in the vicinity of imperfections in the surface when the surface is in contact with an electroless metal solution, to thereby prevent electroless deposition of metal on the surface in the vicinity of said imperfections.

15. In an electrical circuit, an insulating base having electroless metal bonded to designated areas of the surface thereof, said surface having metal free areas which are provided with a poison which is capable of lowering the catalytic activity of the surface in the vicinity of imperfections present in the surface when the surface is in contact with an electroless metal solution, to thereby prevent electroless deposition of metal on the surface in the vicinity of said imperfections.

16. The circuit of claim 15, wherein said poison comprises a member selected from the group consisting of sulfur, tellurium, selenium, polonium, arsenic and mixtures of the foregoing.

17. The circuit of claim 15, wherein the electroless metal is electroless copper.

18. The circuit of claim 15, wherein the eelctroless copper is bonded to the base by an adhesive material which contains an agent catalytic to the deposition of electroless metal.

19. The circuit of claim 15, wherein holes are provided in the member, said holes having surrounding metallized walls providing an electrical interconnection between areas of conducting metal on separated surfaces of the insulating member.

20. A process of limiting the areas of the metal deposited from an electroless metal plating bath on a base member, which comprises applying to areas of the base which are to receive no deposit of electroless metal, a thin layer of a water-insoluble material containing a poison comprising an element selected from the group consisting of sulfur, selenium, tellurium, polonium, arsenic, and mixtures of the foregoing, and depositing metal on other areas of the base from the electroless metal plating bath.

21. A process according to claim 20 in which the poison containing material is applied only to those areas which are to be free of electroless metal.

22. A process according to claim 20 in which the poison containing material is applied over the surface of the entire base member and areas of the poison containing material are thereafter rendered catalytic to the reception of electroless copper.

23. The process of claim 20 wherein said base member is a metal.

24. A process of limiting the areas of the metal deposited from an electroless copper plating bath on an insulating base member, which comprises applying to areas of base member a thin layer of a carrier containing at least about 2 percent by weight of a polysulfide rubber material, rendering areas of the base catalytic to the reception of electroless metal, and thereafter metallizing the catalytic areas by immersion in an electroless copper plating bath.

References Cited

UNITED STATES PATENTS

| | | | |
|---|---|---|---|
| 2,762,723 | 9/1956 | Talmey et al. | 117—130 |
| 2,884,344 | 4/1959 | Ramirez | 117—130 |
| 3,075,856 | 1/1963 | Lukes | 117—47 |

OTHER REFERENCES

Brenner et al.: Journal of Research, Nat. Bureau of Standards, vol. 39, November 1947 (RP 1835), p. 389.

Saubestre: Metal Finishing, June 1962, p. 70.

RALPH S. KENDALL, *Primary Examiner.*

U.S. Cl. X.R.

117—5.5, 47, 97, 132, 160, 213, 227; 118—500